(12) United States Patent
Willis

(10) Patent No.: US 7,091,787 B2
(45) Date of Patent: Aug. 15, 2006

(54) TRANSCONDUCTANCE AMPLIFIER WITH TEMPERATURE SENSITIVE CURRENT LIMITING

(75) Inventor: Scott C. Willis, Fairfax Station, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 2 days.

(21) Appl. No.: 10/873,902

(22) Filed: Jun. 22, 2004

(65) Prior Publication Data

US 2005/0280469 A1     Dec. 22, 2005

(51) Int. Cl.
*H03F 3/26* (2006.01)

(52) U.S. Cl. .................................. 330/255; 330/267

(58) Field of Classification Search ..................... None
See application file for complete search history.

(56) References Cited

U.S. PATENT DOCUMENTS 5,696,459 A * 12/1997 Neugebauer et al. ....... 327/108

6,903,610 B1 * 6/2005 Aoki et al. .................. 330/267

OTHER PUBLICATIONS

PCT International Search Report dated Feb. 22, 2006 of International Application No. PCT/US05/21875 filed Jun. 22, 2005.

* cited by examiner

*Primary Examiner*—Robert Pascal
*Assistant Examiner*—Alan Wong
(74) *Attorney, Agent, or Firm*—Mark A. Wurm; Daniel J. Long

(57) ABSTRACT

A transconductance amplifier generally limits its current output, and specifically decreases its current output as a function of temperature. The circuit is made up of an operational amplifier and two drive transistors that are connected to a first part of the amplifier circuit and a second part of the amplifier circuit respectively. The first part of the circuit is driven by positive input voltages, and the second part of the circuit is driven by negative input voltages. A transistor in each part of the circuit clamps a voltage, thereby limiting the current output. The negative temperature coefficient of the transistor also decreases the output current as the temperature of the circuit rises.

23 Claims, 2 Drawing Sheets

US 7,091,787 B2

TRANSCONDUCTANCE AMPLIFIER WITH TEMPERATURE SENSITIVE CURRENT LIMITING

The invention described herein was made under Contract (Grant) No. 03-009019-47236 with the Government of the United States of America and may be manufactured and used by and for the Government of the United States for governmental purposes without the payment of any royalties thereon or therefor.

FIELD OF THE INVENTION

The present invention relates to transconductance amplifiers, and in particular, transconductance amplifiers having current limits that are functions of temperature.

BACKGROUND OF THE INVENTION

Many electronic systems require power amplifiers to drive capacitive loads. For example, power amplifier electronics are commonly required in satellites for various servo-control systems such as piezoelectric actuators for imaging applications. However, the high capacitance associated with piezoelectric actuators poses a challenge to maintaining stability and accuracy with conventional amplifier topologies. The art is therefore in need of an amplifier circuit with low quiescent current, and a current limit that reduces as the temperature rises for thermal protection of the electronic components of the amplifier circuit.

SUMMARY OF THE INVENTION

The present invention is a transconductance amplifier circuit that limits the current, and furthermore reduces the current as the ambient temperature of the circuit rises. In one embodiment, a unity gain operational amplifier receives a source signal and biases either an NPN transistor or a PNP transistor. The NPN transistor drives one half of the circuit, and the PNP transistor drives the other half of the circuit. A collector current is established through the NPN or PNP transistor, and two other transistors, one of which is diode connected to the NPN drive transistor, and the other of which is diode connected to the PNP transistor, have emitter currents equal to the collector currents of the drive transistors. The current flows to another transistor having two resistors connected in parallel to its base, and current flowing through the base junction establishes the voltage ($V_{BE}$) across the junction thereby determining whether the transistor is on or off.

At some point of operation, as dictated by the level of input voltage, the $V_{BE}$ of the transistor with the parallel connected resistors reaches a level that turns on the transistor. At this point, the current output is at a certain level. Then, at voltages above that level, the $V_{BE}$ clamps the emitter voltage which limits the voltage drop across the parallel resistors, and consequently the current through output transistors. Additionally, since the base emitter voltage ($V_{BE}$) falls at approximately −2.2 mV per ° C. as the ambient temperature of the amplifier circuit is increased, the point at which the transistor starts to conduct drops, and this in turn reduces the current output by the amplifier circuit.

It is therefore an object of a preferred embodiment of the present invention to limit the current in a transconductance amplifier circuit.

It is another object of a preferred embodiment of the present invention to reduce the current in a transconductance amplifier circuit as the ambient temperature of the circuit rises.

DETAILED DESCRIPTION OF THE INVENTION

Figure 1:
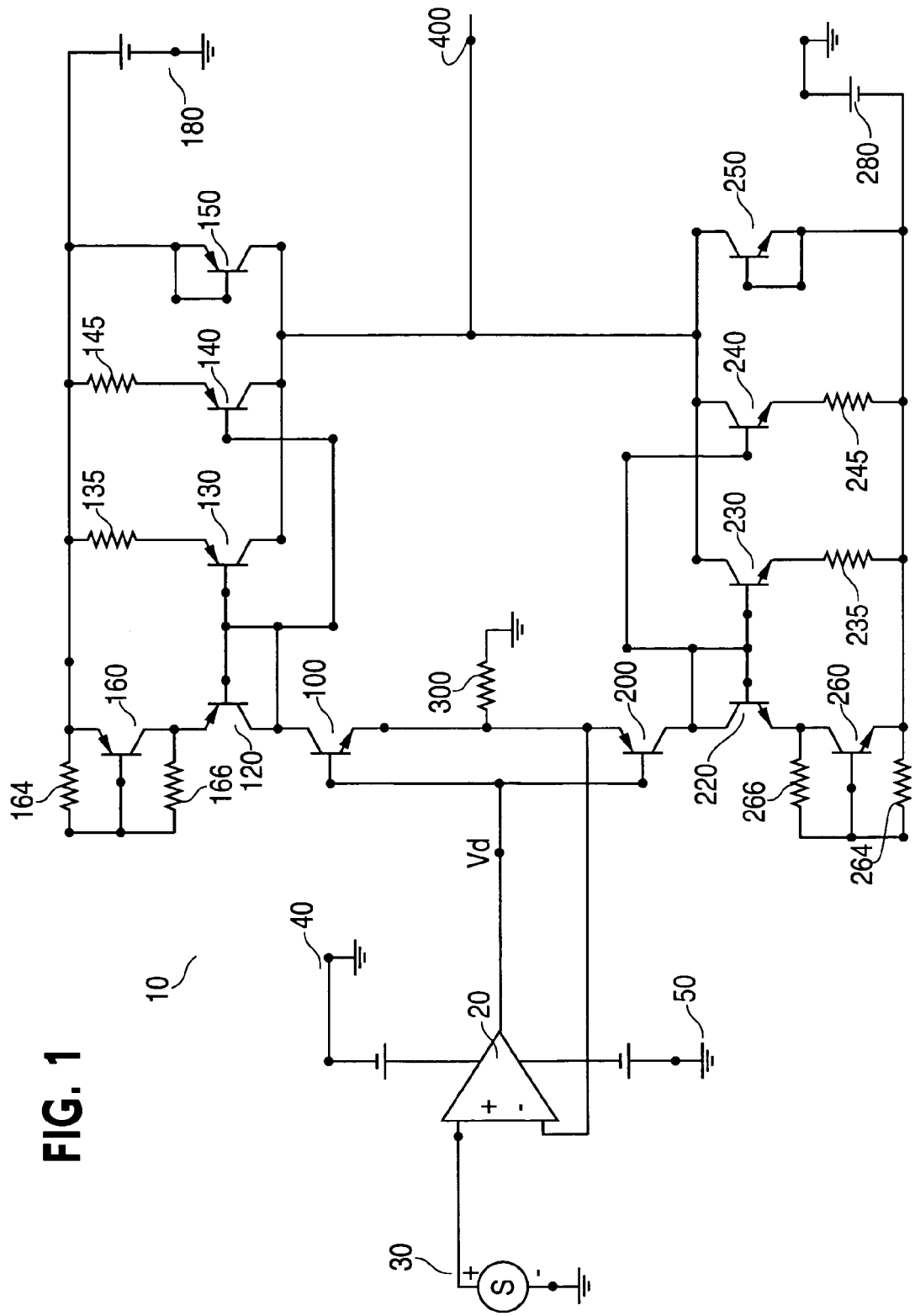
FIG. 1 is a circuit diagram of an embodiment of the transconductance amplifier of the present invention.

FIG. 1 illustrates an embodiment of the transconductance amplifier of the present invention.

A transconductance amplifier 10 has a general purpose op amp 20 that receives input from a signal source 30. An example of such an op amp that could be used in the present invention is Model No. AD8610 manufactured by Analog Devices. The op amp 20 is powered by supply voltages 40 and 50.

The output of op amp 20 is connected to a two part circuit. It is coupled to a first part of the two part circuit through an NPN transistor 100 (e.g. Zetex ZTX857), and coupled to a second part of the circuit through a PNP transistor 200 (e.g. Zetex ZTX957). The first part of the circuit encompasses transistors 100, 120, 130, 140, 150 and 160. The second part of the circuit encompasses transistors 200, 220, 230, 240, 250 and 260. The base-emitter connection of transistor 100 is back to back with transistor 200. That is, the emitter of transistor 100 is connected to the emitter of transistor 200, and both in turn are connected in parallel to resistor 300 which is connected to ground. The emitters of transistors 100 and 200 are further connected in parallel to the negative input terminal of the op amp 20.

The collector of transistor 100 is coupled to the collector of PNP transistor 120, and to the bases of PNP transistors 130 and 140. The base of transistor 120 is coupled to the bases of transistors 130 and 140. The collectors of transistors 130, 140 and 150 are shunted to the circuit output at 400. The transistors 120, 130 and 140 form a current mirror. Transistor 150 is configured as a diode, using the collector-base junction (i.e. the base-emitter is shorted out) for a higher voltage rating. This helps to prevent reverse voltage damage to transistors 120, 130 and 140 if the output is held high with a capacitive load and voltage source 180 is removed. Transistor 150 is used during startups and shutdowns, and clamps output voltage to supply voltage.

The emitters of transistors 130 and 140 are connected to the emitter of transistor 160. The emitter and collector of transistor 160 feed back to the base of transistor 160 through resistors 164 and 166 respectively. A supply voltage 180 powers the transistors 120, 130, 140, 150 and 160. The supply voltage 180 may be integrated with the supply voltages 40 and 50. Also, transistors 130 and 140 may be replaced by a single transistor, or by a series of three or more transistors. As the number of transistors in such a series increases, the heat that builds up in the circuit is spread out among those transistors.

The output of op amp 20 is connected to a second part of the two part circuit through a PNP transistor 200 (e.g. Intel's Model No. ZTX957). The collector of transistor 200 is coupled to the collector of NPN transistor 220, and to the bases of NPN transistors 230 and 240. The base of transistor 220 is coupled to the bases of transistors 230 and 240. The collectors of transistors 230, 240 and 250 are shunted to the circuit output at 400. The transistors 220, 230 and 240 form a current mirror. Transistor 250, like transistor 150, is configured as a diode, using the collector-base junction for a higher voltage rating. This helps to prevent reverse voltage damage to transistors 220, 230 and 240 if the output is held high with a capacitive load and voltage source 280 is removed. Transistor 250 is used during startups and shutdowns, and clamps output voltage to supply voltage.

The emitters of transistors 230 and 240 are connected to the emitter of transistor 260. The emitter and collector of transistor 260 feed back to the base of transistor 260 through resistors 264 and 266 respectively. A supply voltage 280 powers the transistors 220, 230, 240, 250 and 260. The supply voltage 280 may be integrated with the supply voltages 40 and 50. Also, transistors 230 and 240 may be replaced by a single transistor, or by a series of three or more transistors. As the number of transistors in such a series increases, the heat that builds up in the circuit is spread out among those transistors.

The amplifier 10 is a class B amplifier, i.e. either the top portion of the amplifier is operating or the bottom portion is operating. The top and bottom portions are not on at the same time. Also, the top and bottom portions of the amplifier circuit operate in the same manner, except that the top portion operates for positive voltages and it sources load current, while the bottom portion operates for negative voltages and it sinks load current.

The operation of the amplifier circuit will now be described. For this description, certain input voltages and resistances will be used. It should be understood that these values are meant for illustrative purposes only, not as limitations, and that the amplifier circuit of the present invention can work with other values and components in other situations and conditions as determined by one of ordinary skill in the art.

For example, if the signal source 30 supplies an input voltage of positive 1 volt to op amp 20, the output of the op amp, since it functions as a unity gain buffer, will be approximately 1.7 volts (i.e. $V_d$=1.7 volts). This voltage biases transistor 100, which serves as a drive transistor, so that the voltage across resistor 300 is very near 1 volt. The transistor gain is sufficiently high ($\beta$>100) so that the base current of the transistor 100 is negligible. Since the base current of the transistor 100 is negligible, the current across resistor 300 is about 10 mA (I=V/R=1 V/100 $\Omega$=0.01 A). This is also the current across the collector of transistor 100 because the gain of the transistor 100 is high. Therefore, the op amp 20, with its negative feedback, forces the same voltage across the resistor 300 as was input at source 30, and this limits the current through the transistor 100, and provides a current through resistor 300 that equals the input voltage divided by the resistance of resistor 300. Resistor 300 also limits the peak output current required by the op amp 20.

Transistor 120 is diode connected to transistor 100, so that the emitter current of transistor 120 is also 10 mA. The base currents of transistors 130 and 140 are small in comparison because of the gain of those transistors. The base current of transistor 160 is also 10 mA, and with resistor values of 12.5 $\Omega$ and 487.5 $\Omega$ for resistors 164 and 166 respectively, the voltages across resistors 164 and 166 are 0.125 V and 4.875 V respectively (10 mA*12.5 $\Omega$=0.125 V; 10 mA*487.5 $\Omega$=4.875 V). Therefore, the current through resistor 300 establishes the voltage across resistors 164 and 166. The voltage across resistor 164 is the base emitter voltage ($V_{BE}$) for transistor 160. Since this is less than the 0.6 volts required to turn on the transistor, transistor 160 is off and no current flows through the collector of transistor 160.

The voltages across resistors 164 and 166 add, and since resistors 135 and 145 are in parallel, the voltage across resistors 135 and 145 is 5.0 V (0.125+4.875=5.0 V). The value for resistors 135 and 145 for this embodiment are 100 $\Omega$. The base emitter voltage of transistor 120 and the base emitter voltages for transistors 130 and 140 cancel each other out. That is, the diode connected transistor 120 matches the offsets of transistors 130 and 140, so that the transistors 120, 130 and 140 function as a current mirror. In this embodiment, the current through resistors 164 and 166 is the same as, or mirrors, the current through resistor 300. Consequently, the collector current for both transistors 130 and 140 is 50 mA (I=V/R=5 V/100 $\Omega$=50 mA). Transistors 130 and 140 are the output transistors, and the collector currents for these two transistors add to generate a current at output 400 of 100 mA. With the output of 100 mA, the transconductance gain, when the source supplies a voltage of 1 V, is 100 mA/V. The transconductance gain equation for this region is (since resistors 135 and 145 have the same resistance):

$$[2*R145*(R164+R166)/R300].$$

When the input voltage at source 30 rises to 5 volts, the voltage at the output of op amp 20 is very near 5.7 volts. This output biases transistor 100 so that the voltage across resistor 300 equals the voltage at the source, i.e. 5 volts. Once again, it is assumed that the gain of transistor 100 is sufficiently high ($\beta$>100) so that the base current of transistor 100 is negligible. Since the base current of transistor 100 is negligible, the current across resistor 300 is 50 mA (5 V/100 $\Omega$=50 mA). As before, this is also the collector current for transistor 100 since the gain of transistor 100 is high. The collector current of transistor 120, since it is diode connected to transistor 100, is also 50 mA (As is the base current for transistor 160). The base currents of transistors 130 and 140 remain negligible. The voltages across resistors 164 and 166 are 0.625 V and 24.375 V respectively (50 mA*12.5 $\Omega$=0.625 V; 50 mA*487.5 $\Omega$=24.375 V). Since the voltages across the base emitter junctions of transistors 120, 130 and 140 cancel each other out (transistor 120 matches the offsets of transistors 130 and 140), the voltages across resistors 164 and 166 add, and since resistors 135 and 145 are in parallel, the summed voltage of 25 V (0.625 V+24.375 V=25 V) drops across both resistors 135 and 145. Since the voltage drop across the 12.5 $\Omega$ resistor is greater than 0.6 volts, transistor 160 turns on, reduces the voltage across resistors 135, 145, 164 and 166, and limits the current. That is, transistor 160 functions as a shunt, preventing current from going through resistors 164 and 166. The collector current then for each of transistors 130 and 140 is 250 mA (25 V/100 $\Omega$=250 mA), and these currents sum to produce a current at output 400 of 500 mA. The transconductance gain, with an input of 5 V, is approximately 0.5 A/5 V or 0.1 A/V.

When the input at 30 reaches 10 V, op amp 20 biases transistor 100 so that the voltage across resistor 300 is the same as the 10 V input ($V_d$=10.7 V). Once again, in this case just as in the previous two cases, it is assumed that the gain of transistor 100 is sufficiently high ($\beta$>100) so that the base current of transistor 100 is negligible. The current through resistor 300 is then 100 mA (10 V/100 $\Omega$), which is also the collector current at transistor 100. Transistor 120 is still diode connected to transistor 100, causing the emitter current at transistor 120 to be 100 mA also. The base current at transistors 130 and 140 remains negligible. Now, the voltage across the base emitter junction of transistor 160 clamps the voltage across resistor 166 at 0.625 V. That is, transistor 160 forms a $V_{BE}$ multiplier with resistors 164 and 166, clamping the voltage to $V_{BE}$ (1+R164/R166), so that the voltage is not increased proportional to increased current through resistor 300. The voltage across resistor 166 is 24.375 V [(0.625 V/12.5 Ω)*487.5 Ω=24.375 V]. The voltages across resistors 164 and 166 add to 25 volts, and this is the voltage across resistors 135 and 145. The collector current through transistors 130 and 140 is 0.25 A (25 V/100 Ω). These currents add to approximately 0.5 A which is the output current at 400.

Figure 2:
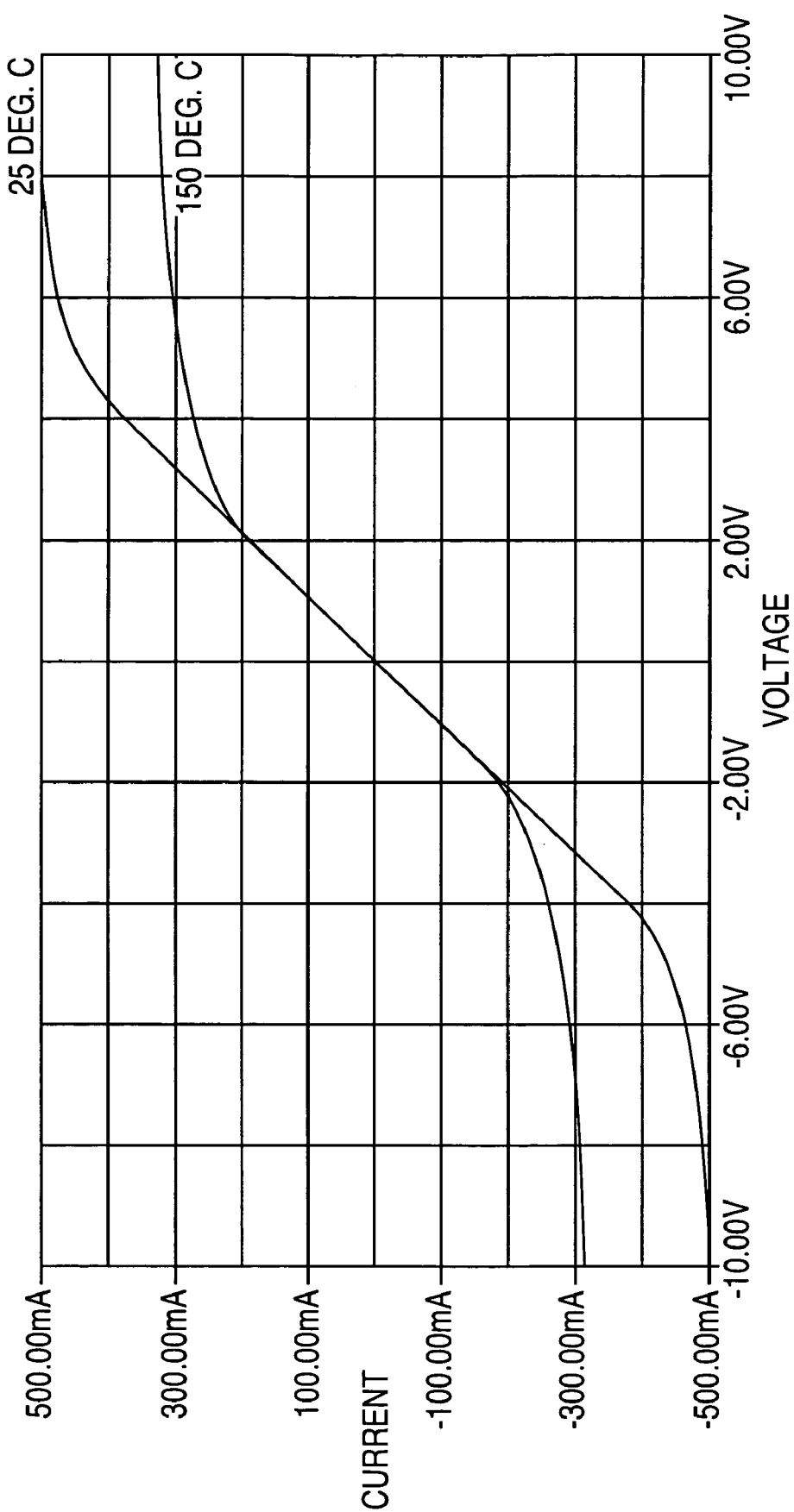
FIG. 2 is a graph illustrating the relationship between voltage input, current output, and temperature for one embodiment of the present invention.

Consequently, without transistor 160, the current would be linear as a function of the voltage. With transistor 160 in place however, the maximum current is clamped for larger voltages (absolute value) as shown in FIG. 2. Additionally, this clamping level is a function of temperature. Specifically, since the base emitter voltage ($V_{BE}$) falls approximately −2.2 mV per °C., the point at which transistor 160 starts to conduct drops which in turn makes the current limit lower. Therefore, the amplifier current/power capacity is reduced as the base-emitter voltage of transistor 160 is reduced with increasing temperature. FIG. 2 illustrates a lower current level for an amplifier at 150° C. than for a circuit at 25° C.

When the input voltage to the amplifier 10 at source 30 is negative, the bottom half of the circuit in FIG. 1 is activated, and functions as follows.

For example, if the signal source 30 supplies an input voltage of negative 1 volt to op amp 20, the output of the op amp, since it functions as a unity gain buffer, will be approximately −1.7 volts (i.e. $V_d$=−1.7 volts). This voltage biases transistor 200, which like transistor 100 serves as a drive transistor, so that the voltage across resistor 300 is very near −1 volt. The transistor gain remains sufficiently high (β>100) so that the base current of the transistor 200 is negligible. Since the base current of the transistor 200 is negligible, the current across resistor 300 is about −10 mA (I=V/R=−1 V/100 Ω=−0.01 A). This is also the current across the collector of transistor 200 because the gain of transistor 200 is high. The negative feedback of the op amp 20 provides the same functions as it did in connection with the operation of the top portion of the circuit. That is, it forces the same voltage across the resistor 300 as was input at source 30, which limits the current through the transistor 200, and provides a current through resistor 300 that equals the input voltage divided by the resistance of resistor 300. The negative feedback continues to prevent damage to the op amp.

Transistor 220 is diode connected to transistor 200, so that the emitter current of transistor 220 is also −10 mA. The base currents of transistors 230 and 240 are small in comparison because of the gain of those transistors. The base current of transistor 260 is also −10 mA, and with resistor values of 12.5 Ω and 487.5 Ω for resistors 264 and 266 respectively, the voltages across resistors 264 and 266 are −0.125 V and −4.875 V respectively (−10 mA*12.5 Ω=−0.125 V; −10 mA*487.5 Ω=−4.875 V). Therefore, the current through resistor 300 establishes the voltage across resistors 264 and 266. The voltage across resistor 264 is the base emitter voltage ($V_{BE}$) for transistor 260. Since this is less than the 0.6 volts required to turn on the transistor, transistor 260 is off and no current flows through the collector of transistor 260.

The voltages across resistors 264 and 266 add, and since resistors 235 and 245 are in parallel, the voltage across resistors 235 and 245 is −5.0 V (−0.125+−4.875=−5.0 V). The value for resistors 235 and 245 for this embodiment are 100 Ω. Then, the base emitter voltage of transistor 220 and the base emitter voltages for transistors 230 and 240 cancel each other out. Once again, the diode connected transistor 220 matches the offsets of transistors 230 and 240, thereby forming a current mirror. As with the top part of the circuit, the current through resistors 264 and 266 is the same, or mirrors, the current through resistor 300. Consequently, the collector current for both transistors 230 and 240 is −50 mA (I=V/R=5 V/100 Ω=−50 mA). Transistors 230 and 240 are the output transistors, and the collector currents for these two transistors add to generate a current at output 400 of −100 mA. With an output of −100 mA, the transconductance gain, when the source supplies a voltage of −1 V, is 100 mA/V.

When the input voltage at source 30 rises to −5 volts, the voltage at the output of op amp 20 is very near −5.7 volts. This output biases transistor 200 so that the voltage across resistor 300 equals the voltage at the source, i.e. −5 volts. Once again, it is assumed that the gain of transistor 200 is sufficiently high (β>100) so that the base current of transistor 200 is negligible. Since the base current of transistor 100 is negligible, the current across resistor 300 is −50 mA (5 V/100 Ω=−50 mA). As before, this is also the collector current for transistor 200 since the gain of transistor 200 is high. The collector current of transistor 220, since it is diode connected to transistor 200, is also −50 mA (As is the base current for transistor 260). The base current of transistors 230 and 240 remains negligible. The voltages across resistors 264 and 266 are −0.625 V and −24.375 V respectively (−50 mA*12.5 Ω=−0.625 V; −50 mA*487.5 Ω=−24.375 V). Since the voltages across the base emitter junctions of transistors 220, 230 and 240 cancel each other out (transistor 220 matches the offset of transistors 230 and 240), the voltages across resistors 264 and 266 add, and since resistors 235 and 245 are in parallel, the summed voltage of −25 V (−0.625 V+−24.375 V=−25 V) drops across both resistors 235 and 245. Transistor 260 turns on, reduces the voltage across resistors 235, 245, 264 and 266, and limits the current. That is, transistor 260 functions as a shunt, preventing current from going through resistors 264 and 266. The collector current for each of transistors 230 and 240 is −250 mA (−25 V/100 Ω=−250 mA), and these currents sum to produce a current at output 400 of −500 mA. The transconductance gain, with an input of −5 V, is approximately 0.5 A/5 V or −0.1 A/V.

When the input at 30 reaches −10 V, op amp 20 biases transistor 200 so that the voltage across resistor 300 is the same as the −10 V input ($V_d$=−10.7 V). Once again, in this case just as in the other cases, it is assumed that the gain of transistor 200 is sufficiently high (β>100) so that the base current of transistor 200 is negligible. The current through resistor 300 is then −100 mA (−10 V/100 Ω), which is also the collector current at transistor 200. Transistor 220 is still diode connected to transistor 200, causing the emitter current at transistor 220 to be −100 mA also. The base current at transistors 230 and 240 remains negligible. Now, the voltage across the base emitter junction of transistor 260 clamps the voltage across resistor 266 at −0.625 V. That is, transistor 260 forms a $V_{BE}$ multiplier with resistors 264 and 266, clamping the voltage to $V_{BE}$ (1+R264/R266). The voltage across resistor 264 then is −24.375 V [(−0.625 V/12.5 Ω)*487.5 Ω=−24.375 V]. The voltages across resistors 264 and 266 sum to −25 volts, and this is the voltage across resistors 235 and 245. The collector current through transistors 230 and 240 is −0.25 A (−25 V/100 Ω). These currents add to approximately −0.5 A which is the output current at 400.

Embodiments of the transconductance amplifier of the present invention are especially useful in driving capacitive loads in which the load voltage is proportional to the integral of the output current of the amplifier circuit. Also, systems embodying the present invention may include a control loop to regulate the load voltage. That is, the voltage across the capacitive load can be measured, determined if it is high or low, and the current of the transconductance amplifier adjusted accordingly so as to raise or lower the voltage drop across the capacitive load.

While the invention has been described in its preferred embodiment, it is to be understood that the words used are words of description rather than limitation and that changes may be made within the purview of the appended claims without departing from the true scope and spirit of the invention in its broader aspects.

The invention claimed is:

1. A transconductance amplifier comprising:
   a first voltage source;
   an operational amplifier coupled to said first voltage source;
   a first NPN transistor and a first PNP transistor coupled to an output of said operational amplifier, said first NPN transistor and said first PNP transistor coupled back to back;
   a first resistor coupled to the emitters of said first NPN transistor and said first PNP transistor;
   a second PNP transistor, said second PNP transistor diode coupled to said first NPN transistor;
   a third PNP transistor, said third PNP transistor forming a current mirror with said second PNP transistor;
   a fourth PNP transistor, said fourth PNP transistor coupled to the emitters of said second PNP transistor and said third PNP transistor, said fourth PNP transistor further comprising a second resistor and a third resistor, said second resistor and said third resistor parallel-connected to the base of said fourth PNP transistor;
   a second voltage source coupled to said second PNP transistor, said third PNP transistor, and said fourth PNP transistor;
   a second NPN transistor, said second NPN transistor diode coupled to said first PNP transistor;
   a third NPN transistor, said third NPN transistor forming a current mirror with said second NPN transistor;
   a fourth NPN transistor, said fourth NPN transistor coupled to the emitters of said second NPN transistor and said third NPN transistor, said fourth NPN transistor further comprising a fourth resistor and a fifth resistor, said fourth resistor and said fifth resistor parallel-connected to the base of said fourth NPN transistor; and
   a third voltage source coupled to said second NPN transistor, said third NPN transistor and said fourth NPN transistor.

2. The transconductance amplifier according to claim 1, further comprising a sixth resistor coupled to said third PNP transistor.

3. The transconductance amplifier according to claim 2, further comprising a seventh resistor coupled to said third NPN transistor.

4. The transconductance amplifier according to claim 1, further comprising:
   a fifth PNP transistor coupled to said third PNP transistor; and
   a fifth NPN transistor coupled to said third NPN transistor.

5. The transconductance amplifier according to claim 4, further comprising:
   an eighth resistor coupled to said fifth PNP transistor; and
   a ninth resistor coupled to said fifth NPN transistor.

6. The transconductance amplifier according to claim 4, further comprising:
   a sixth PNP transistor coupled to said third and fifth PNP transistors, said sixth PNP transistor configured as a diode.

7. The transconductance amplifier according to claim 4, further comprising:
   a sixth NPN transistor coupled to said third and fifth NPN transistors, said sixth NPN transistor configured as a diode.

8. The transconductance amplifier according to claim 1,
   wherein said first resistor comprises a resistance of about 100 ohms;
   wherein said second and fourth resistors comprise resistances of about 12.5 ohms; and
   wherein said third and fifth resistors comprise resistances of about 487.5 ohms.

9. The transconductance amplifier according to claims 2 or 3, wherein said sixth resistor and said seventh resistor comprise resistances of about 100 ohms.

10. The transconductance amplifier according to claim 5, wherein said eighth resistor and said ninth resistor comprise resistances of about 100 ohms.

11. The tranconductance amplifier according to claim 1, wherein said first voltage source, said second voltage source, and said third voltage source comprise an integrated unit.

12. The transconductance amplifier according to claim 8,
   wherein said first resistor comprises a scalable resistance of 100 ohms;
   wherein said second and fourth resistors comprise scalable resistances of 12.5 ohms; and
   wherein said third and fifth resistors comprise scalable resistances of 487.5 ohms.

13. The transconductance amplifier according to claim 9, wherein said sixth resistor and said seventh resistor comprise scalable resistances of 100 ohms.

14. The transconductance amplifier according to claim 10, wherein said eighth resistor and said ninth resistor comprise scalable resistances of 100 ohms.

15. The transconductance amplifier according to claim 1,
   wherein said third PNP transistor and said third NPN transistor comprise output transistors of said amplifier; and
   further wherein said output transistors are coupled to a capacitive load.

16. The transconductance amplifier according to claim 15, wherein a voltage of said capacitive load is proportional to an integral of an output of said output transistors.

17. The transconductance amplifier according to claim 1, wherein said fourth PNP transistor and said fourth NPN transistor clamp its base emitter voltage, thereby limiting a current output of said amplifier.

18. The transconductance amplifier according to claim 17, wherein a negative coefficient of a base emitter junction of said fourth PNP transistor and said fourth NPN transistor decreases said current output as the temperature of said amplifier increases.

19. The transconductance amplifier according to claim 1, wherein an output of said amplifier is transmitted to a capacitive load;

and further wherein said capacitive load comprises a control loop, said control loop controlling said output of said amplifier such that a voltage across said capacitive load is adjusted.

20. A transconductance amplifier for driving a capacitive load comprising:
a voltage source;
a first NPN transistor and a first PNP transistor, said first NPN transistor and said first PNP transistor coupled back to back;
a first resistor coupled to the emitters of said first NPN transistor and said first PNP transistor;
means to bias said first NPN transistor and said first PNP transistor;
a second PNP transistor, said second PNP transistor diode coupled to said first NPN transistor;
a third PNP transistor, said third PNP transistor forming a current mirror with said second PNP transistor;
a fourth PNP transistor, said fourth PNP transistor coupled to the emitters of said second PNP transistor and said third PNP transistor, said fourth PNP transistor further comprising a second resistor and a third resistor, said second resistor and said third resistor parallel-connected to the base of said fourth PNP transistor;
a second NPN transistor, said second NPN transistor diode coupled to said first PNP transistor;
a third NPN transistor, said third NPN transistor forming a current mirror with said second NPN transistor; and
a fourth NPN transistor, said fourth NPN transistor coupled to the emitters of said second NPN transistor and said third NPN transistor, said fourth NPN transistor further comprising a fourth resistor and a fifth resistor, said fourth resistor and said fifth resistor parallel-connected to the base of said fourth NPN transistor.

21. The transconductance amplifier for driving a capacitive load according to claim 20, wherein said means to bias said first NPN transistor and said first PNP transistor comprises an operational amplifier.

22. The transconductance amplifier for driving a capacitive load according to claim 20, wherein said second PNP transistor, said third PNP transistor, said fourth PNP transistor, said second NPN transistor, said third NPN transistor and said fourth NPN transistor are coupled to said voltage source.

23. A transconductance amplifier comprising:
a first voltage source;
an operational amplifier coupled to said first voltage source;
a first NPN transistor and a first PNP transistor coupled to an output of said operational amplifier, said first NPN transistor and said first PNP transistor coupled back to back;
a first resistor coupled to the emitters of said first NPN transistor and said first PNP transistor;
a second PNP transistor, said second PNP transistor diode coupled to said first NPN transistor;
a third PNP transistor, said third PNP transistor forming a current mirror with said second PNP transistor;
a fourth PNP transistor, said fourth PNP transistor coupled to the emitters of said second PNP transistor and said third PNP transistor, said fourth PNP transistor further comprising a second resistor and a third resistor, said second resistor and said third resistor parallel-connected to the base of said fourth PNP transistor;
a second voltage source coupled to said second PNP transistor, said third PNP transistor, and said fourth PNP transistor;
a second NPN transistor, said second NPN transistor diode coupled to said first PNP transistor;
a third NPN transistor, said third NPN transistor forming a current mirror with said second NPN transistor;
a fourth NPN transistor, said fourth NPN transistor coupled to the emitters of said second NPN transistor and said third NPN transistor, said fourth NPN transistor further comprising a fourth resistor and a fifth resistor, said fourth resistor and said fifth resistor parallel-connected to the base of said fourth NPN transistor;
a third voltage source coupled to said second NPN transistor, said third NPN transistor and said fourth NPN transistor;
a sixth resistor coupled to said third PNP transistor;
a seventh resistor coupled to said third NPN transistor;
a sixth PNP transistor coupled to said third and fifth NPN transistors, said sixth PNP transistor configured as a diode; and
a sixth NPN transistor coupled to said third and fifth NPN transistors, said sixth NPN transistor configured as a diode.

* * * * *